United States Patent
Otoma

(10) Patent No.: US 7,573,929 B2
(45) Date of Patent: Aug. 11, 2009

(54) VERTICAL-CAVITY SURFACE-EMITTING LASER DIODE DEVICE

(75) Inventor: Hiromi Otoma, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 45 days.

(21) Appl. No.: 11/580,579

(22) Filed: Oct. 13, 2006

(65) Prior Publication Data

US 2009/0168819 A1    Jul. 2, 2009

(30) Foreign Application Priority Data

Jun. 6, 2006    (JP)    ............................. 2006-157580

(51) Int. Cl.
  *H01S 3/04* (2006.01)
  *H01S 5/00* (2006.01)

(52) U.S. Cl. .................................... 372/50.124; 372/34

(58) Field of Classification Search ............ 372/50.124, 372/34
See application file for complete search history.

(56) References Cited

U.S. PATENT DOCUMENTS

| 6,611,546 | B1 * | 8/2003 | Garnache et al. ............... 372/92 |
| 6,775,310 | B2 * | 8/2004 | Sai et al. ................... 372/45.01 |
| 7,075,959 | B1 * | 7/2006 | Downing et al. .............. 372/35 |
| 2001/0017876 | A1 * | 8/2001 | Kner et al. .................... 372/50 |
| 2001/0021211 | A1 * | 9/2001 | Ueyanagi ..................... 372/46 |

FOREIGN PATENT DOCUMENTS

| JP | 6-151957 | 5/1994 |
| JP | 9-83088 | 3/1997 |
| JP | 11-121852 | 4/1999 |
| JP | 2002-204018 | 7/2002 |

* cited by examiner

*Primary Examiner*—Minsun Harvey
*Assistant Examiner*—Patrick Stafford
(74) *Attorney, Agent, or Firm*—Fildes & Outland, P.C.

(57) ABSTRACT

A vertical-cavity surface-emitting laser diode (VCSEL) device, including a laser element portion formed on a substrate, the laser element portion comprising a multi-layer reflective mirror of a first conductivity type, an active layer, and a multi-layer reflective mirror of a second conductivity type, and a light absorbing heat converting region at a position thermally connected to the laser element portion on the substrate, the light absorbing heat converting region absorbing light and generating heat.

20 Claims, 11 Drawing Sheets

10 VCSEL device

500 Spatial optical transmission system

600 Optical transmission system

700 Optical transmission unit

800 Video transmission system

VERTICAL-CAVITY SURFACE-EMITTING LASER DIODE DEVICE

BACKGROUND

1. Technical Field

The present invention relates to a vertical-cavity surface-emitting laser diode (hereinafter referred to as VCSELs) device used as a light source of optical data processing or high-speed optical communication, and more specifically to a technology of compensating for temperature characteristics of a laser element.

2. Related Art

In technical fields such as optical communication or optical storage, there has been a growing interest in VCSELs. VCSELs have excellent characteristics which edge-emitting semiconductor lasers do not have. For example, VCSELs feature lower threshold current and smaller power consumption. With a VCSEL, a round light spot can be easily obtained. Also, evaluation can be performed while VCSELs are on a wafer, and light sources can be arranged in two-dimensional arrays. With these characteristics, demands especially as light sources in the communication field have been expected to grow.

It is known that VCSELs have a property in which its output varies in accordance with temperature variations when operated at a constant current. When the temperature of a VCSEL increases, optical output decreases, while when the temperature decreases, optical output increases. In a case where a VCSEL is used for a light source in the communication field, for example, in order to avoid communication errors or the like, optical output more than a certain amount is required. On the other hand, the optical output should be restricted to lower than a certain amount in terms of high frequency characteristics or eye-safe, for example. Therefore, variations in optical output due to temperature variations of a VCSEL are restricted by an APC (auto power control) circuit that controls current to be injected into the laser. The APC circuit monitors optical output of the VCSEL, and provides feedback to control drive current in order to keep the optical output constant.

When the increase in optical output due to a low temperature VCSEL is restricted by reducing current by an APC method, the value of current becomes lower than a range that has high frequency characteristics, and thus high-speed response is inhibited. Therefore, for a communication laser, a temperature-controlling device is provided to limit variations in temperature of the laser. However, there has been a problem in that the temperature-controlling device requires a temperature sensor for detecting temperatures, a piezo element, and a voltage controller that controls voltage to be applied to the piezo element. These components increase the cost of a light-emitting element module.

SUMMARY

An aspect of the present invention provides a vertical-cavity surface-emitting laser diode (VCSEL) device, including: a laser element portion formed on a substrate, the laser element portion comprising a multi-layer reflective mirror of a first conductivity type, an active layer, and a multi-layer reflective mirror of a second conductivity type; and a light absorbing heat converting region at a position thermally connected to the laser element portion on the substrate, the light absorbing heat converting region absorbing light and generating heat.

BRIEF DESCRIPTION OF THE DRAWINGS

Embodiments of the present invention will be described in detail based on the following figures, wherein.

DETAILED DESCRIPTION

A description will now be given, with reference to the accompanying drawings, of embodiments of the present invention.

Figure 1A:
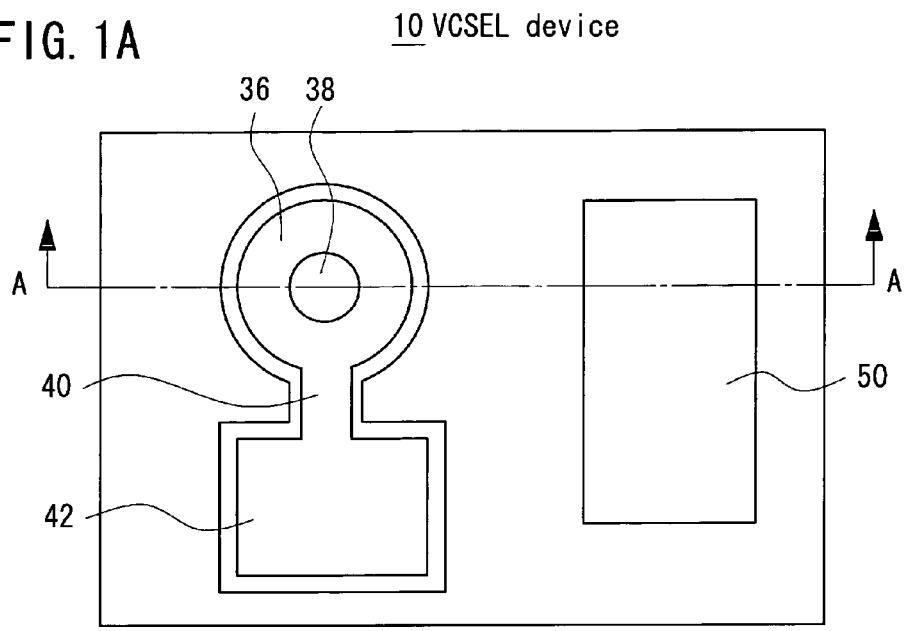
FIG. 1A is a perspective plan view of a VCSEL device according to a first example of the invention.
Figure 15:
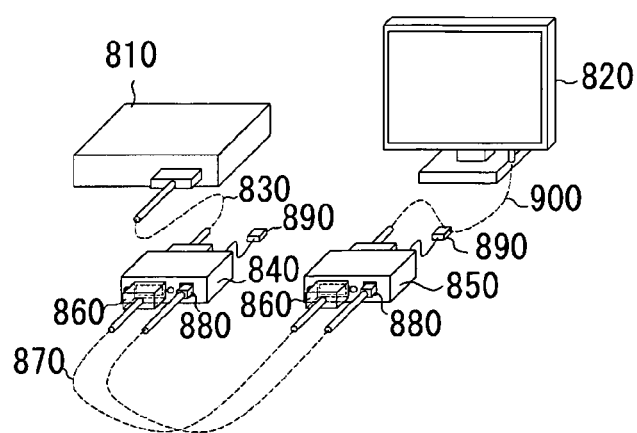
FIG. 15 illustrates a video transmission system in which the optical transmission unit of FIG. 14 is used.

FIG. 1A is a perspective plan view of a VCSEL device according to an example of the invention, and FIG. 15 is a cross sectional view taken along line A-A of FIG. 1A. A VCSEL device 10 includes an n-side (cathode) electrode 22 on the back surface of an n-type GaAs substrate 20. On the upper surface of the substrate, semiconductor layers are multilayered. The semiconductor layers include an n-type AlGaAs semiconductor multi-layer reflective mirror 24, an active layer 26, a p-type current confinement layer (not shown), a p-type AlGaAs semiconductor multi-layer reflective mirror 28, and a p-type GaAs contact layer 30. From the contact layer 30 to a depth that reaches the active layer 26, a ring-shaped insulator 32 is formed by proton ion implantation to define a laser element portion 34. The periphery of the laser element portion 34 is electrically insulated by the insulator 32. On the contact layer 30, an upper p-type (anode) electrode 36 is formed. In a center portion of the upper electrode 36, a round emitting window 38 is formed. The upper electrode 36 is connected to an electrode pad 42 via an extraction wiring 40, and the extraction wiring 40 and the electrode pad 42 are formed on an insulating film (not shown) on the contact layer 30.

At a position that is adjacent to the laser element portion 34, a light absorbing heat converting region 50 is formed. The light absorbing heat converting region 50 is a region that absorbs projected light and converts it into heat. The light absorbing heat converting region 50 is thermally connected to the laser element portion 34 through the GaAs semiconductor substrate 20 or other semiconductor layer. In a case when the amount of heat generation of the light absorbing heat converting region 50 becomes more than a certain amount, the temperature of the laser element portion 34 increase. In a case when the amount of heat generation of the light absorbing heat converting region 50 becomes less than a certain amount, the temperature of the laser element portion 34 decreases. As such, variations in optical output due to temperature variations of the laser element portion 34 can be restricted.

The shape, size, position, material or the like of the light absorbing heat converting region 50 are not limited specifically. However as described later, preferably, to improve light absorbance, a compound having a function of absorbing light and converting it into heat can be used for the light absorbing heat converting region 50. Alternatively, lattice defects or amorphousization by ion implantation or the like may be provided. Alternatively, the material can be made in a mixed crystal state to reduce reflectivity of the projected light. In addition, the light absorbing heat converting region 50 may have a substantially same height as the laser element portion 34, and it can be a groove such as a trench or a via by removing a semiconductor layer.

Figure 1B:
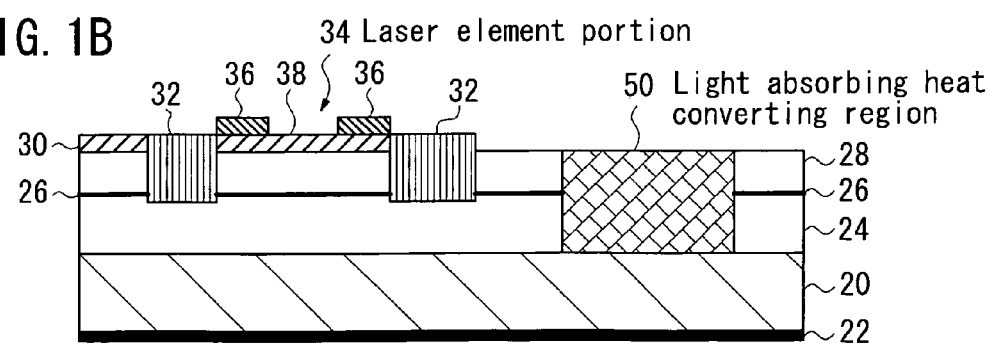
FIG. 1B is a cross sectional view taken along line A-A of FIG. 1A.

In the example of the VCSEL device of FIGS. 1A and 1B, the laser element portion 34 is defined by the insulator 32 by proton implantation. However, the laser element portion 34 may be defined by a post or a mesa structure. In this case, a current confinement layer may be formed in the post. In addition, in the example of the VCSEL device of FIGS. 1A and 1B, a single-spot type of VCSEL having a single laser element portion is shown. However, not limited to this example, it may be a multi-spot type VCSEL, which has plural laser element portions on a substrate. In this case, at least one light absorbing heat converting region that is thermally connected to at least one laser element portion is formed. Preferably, all laser element portions and light absorbing heat converting regions are thermally connected.

Figure 2A:
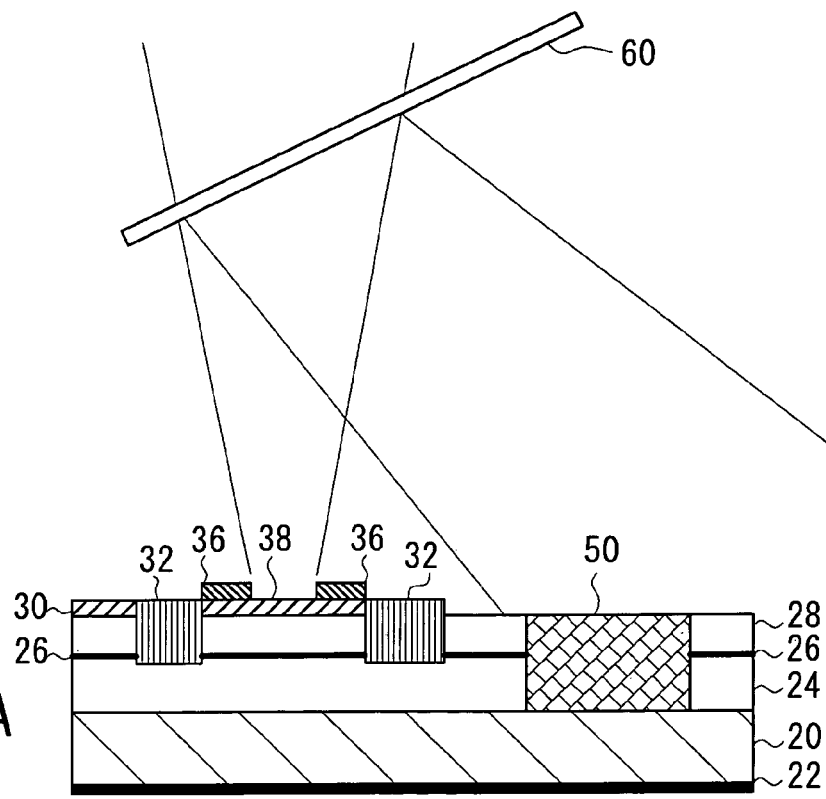
FIGS. 2A and 2B are cross sectional views showing perspective configurations of a VCSEL device according to a second example of the invention.
Figure 2B:
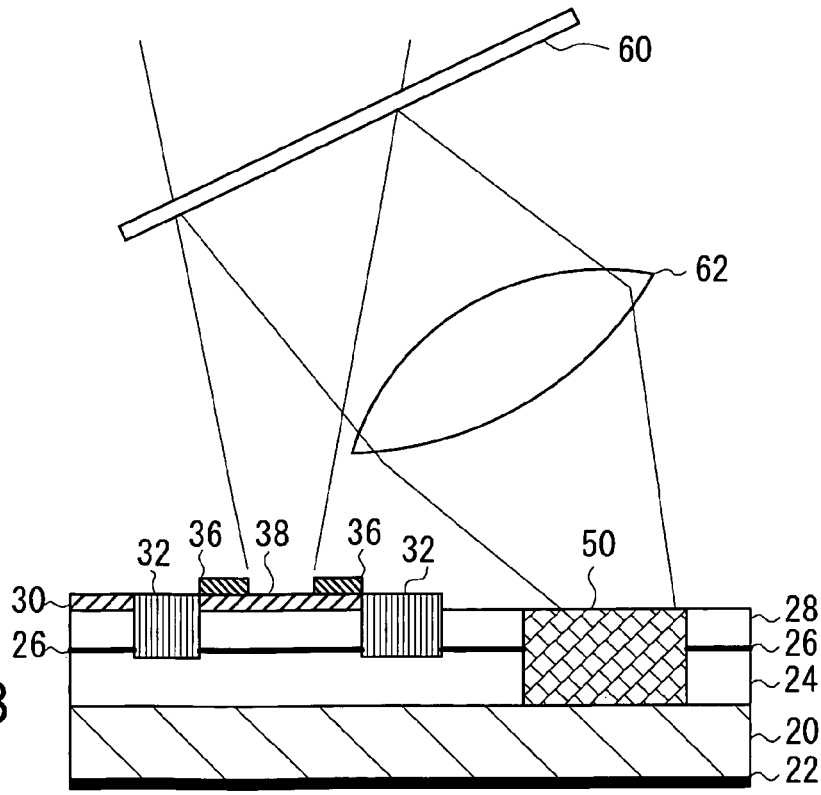

FIGS. 2A and 2B are perspective cross sectional views of a VCSEL device according to a second example of the invention. The VCSEL device includes a reflective mirror 60. The reflective mirror 60 allows a portion of laser light, which may have a wavelength of about 850 nanometers and is emitted from the laser element portion 34, pass through, and reflect a portion of the laser light toward the light absorbing heat converting region 50. The reflective mirror 60 projects a portion, for example, 50%, of laser light onto the light absorbing heat converting region 50. In addition, as shown in FIG. 2B, a lens 62 may be interposed to effectively guide the laser light to the light absorbing heat converting region 50.

In a case where the laser element portion 34 is operated at a constant current, when the temperature of the element increases, optical output decreases. According to the decrease, the amount of light that impinges on the light absorbing heat converting region 50 also decreases, and the amount of heat generation decreases, which lowers the temperature of the element. When the temperature of the element is lowered, optical output increases. Conversely, when the temperature of the element decreases, optical output increases. According to the increase, the amount of light that impinges on the light absorbing heat converting region 50 increases, and the amount of heat generation increases, which raises the temperature of the element. When the temperature of the element increases, optical output decreases.

Figure 3A:
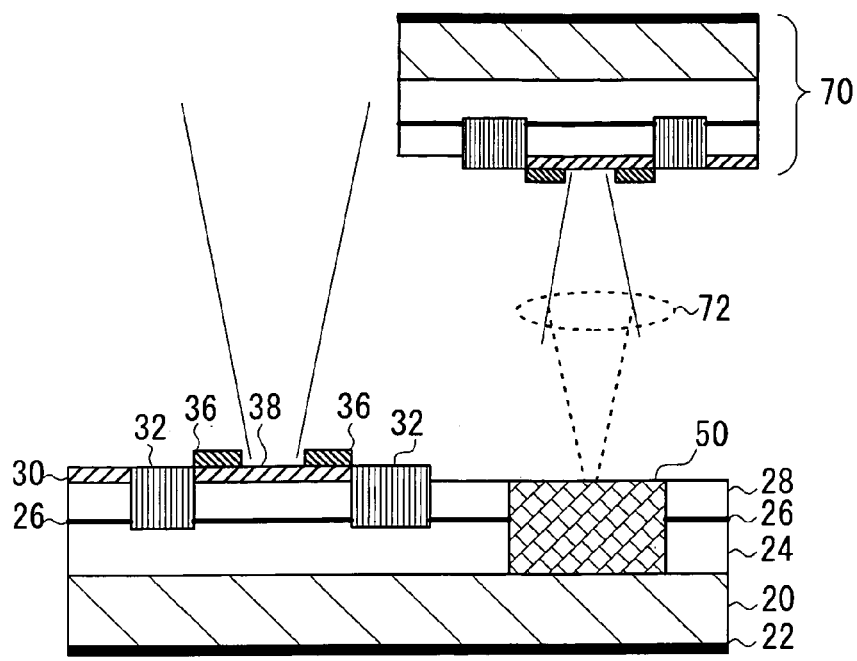
FIGS. 3A and 3B are cross sectional views showing perspective configurations of a VCSEL device according to a third example of the invention.
Figure 3B:
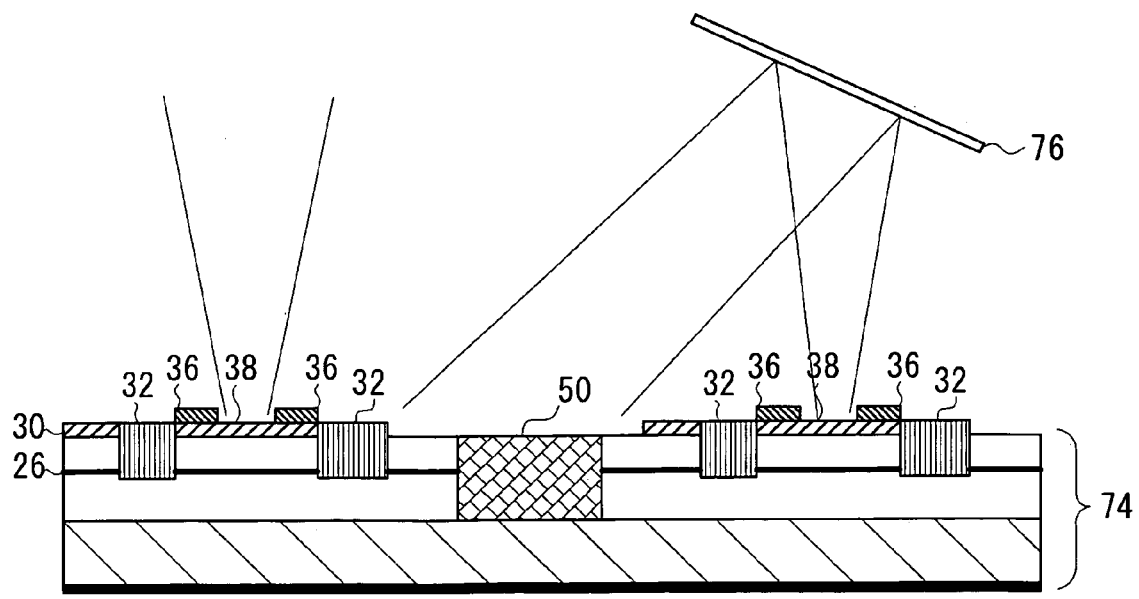

FIGS. 3A and 3B illustrate a VCSEL device according to a third example of the invention. In the third example, independently of the laser element portion 34, a semiconductor laser for projection 70 is used, and laser light of the semiconductor laser for projection 70 is projected onto the light absorbing heat converting region 50. To improve projection efficiency of the laser light, a condensing lens 72 may be used. In addition, as shown in FIG. 3B, on a same substrate, a laser element portion for projection 74 may be formed. In this case, the laser element portion for projection 74 has a same configuration as the laser element portion 34 does, and laser light emitted from the laser element portion for projection 74 is reflected to the light absorbing heat converting region 50 by means of a reflective mirror 76.

The semiconductor laser for projection 70 or the laser element portion 74 is operated at a constant current to project laser light onto the light absorbing heat converting region 50. Therefore, the amount of laser light that projects on the light absorbing heat converting region 50 can be set independently of the optical output of the laser element portion 34. The amount of laser light can be made greater than the case where a portion of laser light of the laser element portion 34 is reflected as described in the second example. Thus, the amount of heat generation of the light absorbing heat converting region 50 also can be made larger, and the range of temperature variations to be compensated for can be made wider. In a case the condensing lens 72 is used, light impinges on the light absorbing heat converting region 50 more effectively, and the amount of heat generation further increases and the compensation range of temperature variations further widens.

Figure 4:
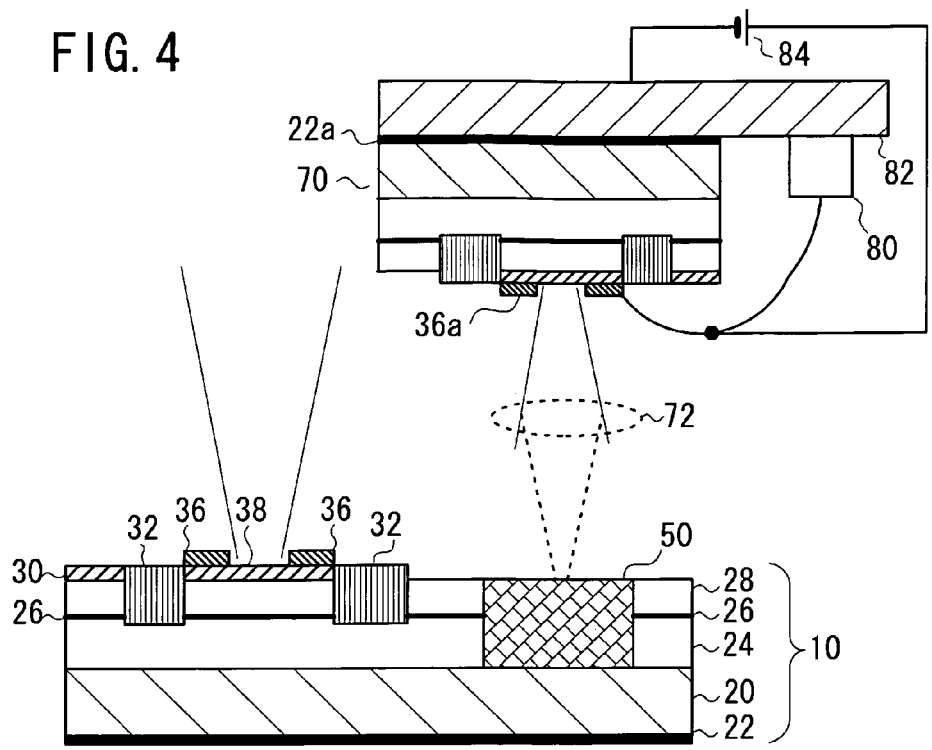
FIG. 4 is a cross sectional view showing a perspective configuration of a VCSEL device according to a fourth example of the invention.

FIG. 4 illustrates a fourth example of the present invention. In the fourth example, a thermistor 80 is connected in parallel with the semiconductor laser for projection 70 of the third example. On a conductive mounter 82, the semiconductor laser for projection 70 and the thermistor 80 are attached. An n-side substrate 22a of the semiconductor laser for projection 70 and a cathode of the thermistor 80 are electrically connected to a negative pole of a constant current source 84 through the mounter 82, and a positive pole of the constant current source 84 is connected to a p-side electrode 36a and an anode of the thermistor 80.

When the semiconductor laser for projection 70 is operated at a constant current, the amount of light that varies with the temperature of the semiconductor laser for projection 70 can be amplified. To be more specific, when temperature of the element increases, light amount of the semiconductor laser for projection 70 decreases, and at the same time, the resistance of the thermistor 80 also decreases, and the current that flows to the semiconductor laser for projection 70 decreases, and thus light amount greatly decreases. This lowers the temperature of the laser element portion 34, and thus optical output from the laser element portion 34 increases.

Meanwhile, when the temperature of the element decreases, light amount of the semiconductor laser for projection 70 increases, and at the same time, the resistance of the thermistor 80 also increases, and the current that flows to the semiconductor laser for projection 70 increases, and thus light amount greatly increases. This raises the temperature of the laser element portion 34, and thus optical output from the laser element portion 34 decreases. As described above, the function of restricting variations in optical output due to temperature variations can be implemented.

Figure 5:
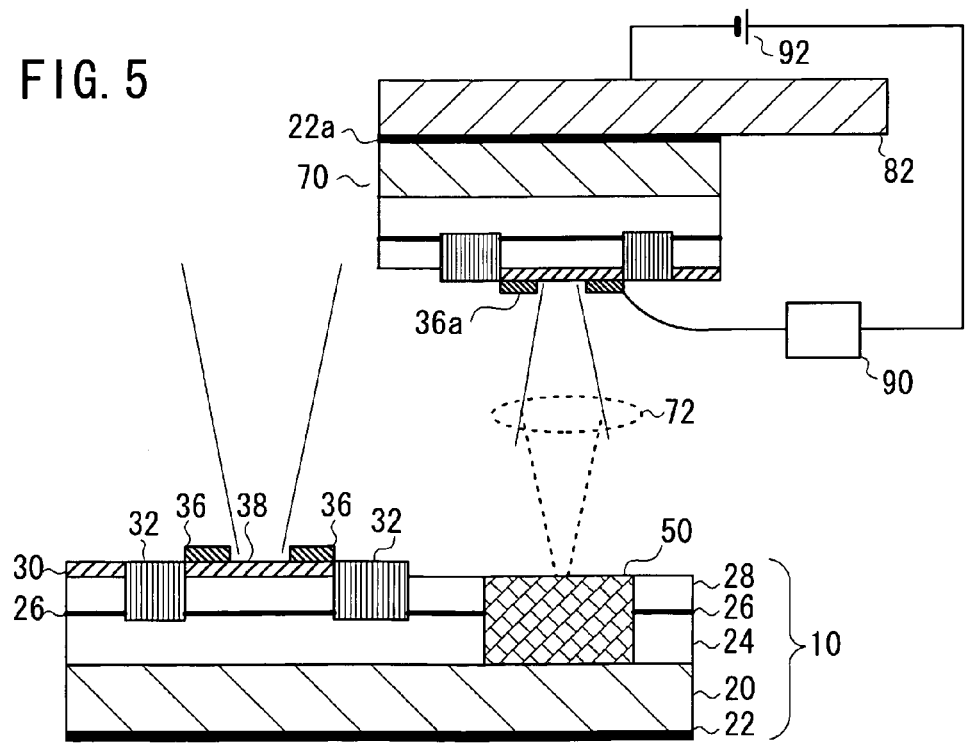
FIG. 5 is a cross sectional view showing a perspective configuration of a VCSEL device according to a fifth example of the invention.

FIG. 5 illustrates a VCSEL device according to a fifth example of the invention. In the fifth example, the semiconductor laser for projection 70 of the third example is connected in series with a resistor 90. An anode of the resistor 90 is connected to the p-side electrode 36a, and a cathode of the resistor 90 is connected to a positive pole of a constant voltage source. When the semiconductor laser for projection 70 is operated at a constant voltage, the amount of light that varies with the temperature of the semiconductor laser for projection 70 can be amplified. To be more specific, when the temperature increases, light amount of the semiconductor laser for projection 70 decreases, but at the same time, the resistance of the resistor 90 increases, and the current that flows to the semiconductor laser for projection 70 decreases, and thus light amount greatly decreases. Conversely, when the temperature decreases, light amount of the semiconductor laser for projection 70 increases, but at the same time, the resistance of the resistor 90 decreases, and the current that flows to the semiconductor laser for projection 70 increases, and thus light amount greatly increases.

As mentioned above, outputs of a VCSEL vary with temperatures. By using the temperature characteristics, a VCSEL itself can be used as a temperature sensor, and the temperature of the VCSEL is controlled by converting laser light emitted from the VCSEL into heat in a light absorbing heat converting region. For example, when the temperature of a VCSEL element decreases, optical output increases. When the optical output increases, the heat generated in a light absorbing heat converting region on which laser light of the optical output impinges increases, which raises the temperature of the element. Conversely, when the temperature of the VCSEL element increases, optical output decreases. When the optical output decreases, the heat generated in the light absorbing heat converting region decreases, which lowers the temperature of the element. As such, in the light absorbing heat converting region on which laser light of the VCSEL impinges, the amount of heat varies to compensate for temperature variations of the VCSEL.

Basic configuration is characterized in that a VCSEL is formed on a semiconductor substrate and a light absorbing heat converting region is monolithically formed on the semiconductor substrate on which the VCSEL is formed. With this configuration, it may work as a laser module that projects laser light emitted from the VCSEL onto the light absorbing heat converting region by using a reflective mirror or the like. It may be a laser module having a configuration in which a semiconductor laser element for projection, which may be a surface-emitting laser, that is different from the VCSEL may be disposed opposing to the substrate on which the VCSEL is formed, and a light absorbing heat converting region on the side of the VCSEL may be projected on by laser light of the semiconductor laser element for projection. In addition, to widen the temperature compensation range of a laser module or to improve the efficiency of heat generation, following methods can be used. (1) Providing a condensing lens between the VCSEL and the semiconductor laser element for projection; (2) connecting a thermistor in parallel with the semiconductor laser element for projection; (3) connecting a resistor in series with the semiconductor laser element for projection.

By projecting a portion of laser light of a VCSEL onto a light absorbing heat converting region on the substrate on which the VCSEL is formed, a function of compensating for temperature variations of the VCSEL may provided and an effect of restricting variations in optical output may be provided as described above. Variations in the amount of optical laser and the amount of semiconductor laser that vary with temperatures can be directly reflected to the amount of heat generation, and therefore, a heat generation controller is not required that includes a processing unit or the like midway. This enables to provide an inexpensive surface-emitting laser module having excellent temperature characteristics.

Accordingly, by monolithically forming a light absorbing heat converting region in a position thermally connected to a laser element portion, temperature variations of the laser element portion can be compensated for in a simple configuration.

Now, a manufacturing method of a VCSEL device according to exemplary embodiments will be described.

(1) Layers Formation on a VCSEL Substrate

Figure 6A:
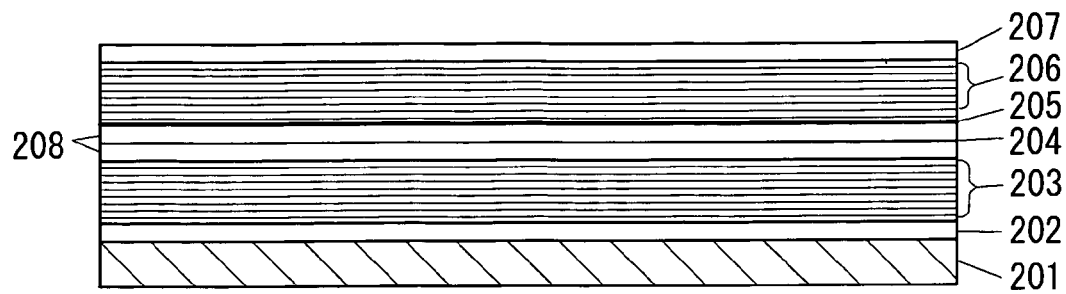
FIGS. 6A to 6C are cross sectional views showing manufacturing processes of an exemplary VCSEL device according to an aspect of the invention.

At first, as shown in FIG. 6, a III-V compound semiconductor bulk crystal, for example, of GaAs, is used as a substrate. Using MOVPE (Metal Organic Vapor Phase Epitaxy), III-V compound (GaAs, AlGaAs) semiconductor thin films are sequentially epitaxially grown and multilayered. Thin films to be multilayered include at least an active layer, a spacer layer, a semiconductor multi-layer DBR (distributed Bragg reflector) reflective mirror, and a contact layer, as described above. To be more specific, on an Si-doped (Nd=1× $10^{18}$ cm$^{-3}$) n-type GaAs semiconductor substrate 201, following layers are sequentially formed; an Si-doped (Nd=1× $10^{18}$ cm$^{-3}$) n-type GaAs buffer layer 202, 40.5 periods of Si-doped (Nd=1×$10^{18}$ cm$^{-3}$) n-type Al$_{0.3}$Ga$_{0.7}$As/Al$_{0.9}$Ga$_{0.1}$As DBR layers 203, an undoped λ Al$_{0.6}$Ga$_{0.4}$As spacer layer 208, a triple quantum well Al$_{0.11}$Ga$_{0.89}$As/Al$_{0.3}$Ga$_{0.7}$As active layer 204, a Zn-doped (Na=7×$10^{17}$ cm$^{-3}$) p-type AlAs layer 205, 30.5 periods of Zn-doped (Na=7×$10^{17}$ cm$^{-3}$) p-type Al$_{0.3}$Ga$_{0.7}$As/Al$_{0.9}$Ga$_{0.1}$As DBR layers 206, and a Zn-doped (Na=1×$10^{19}$ cm$^{-3}$) p-type GaAs layer 207. In interfaces between each layer of the p-type Al$_{0.3}$Ga$_{0.7}$As/Al$_{0.9}$Ga$_{0.1}$As DBR layer, a band barrier buffer layer having a composition of between Al$_{0.3}$Ga$_{0.7}$As and Al$_{0.9}$Ga$_{0.1}$As can be interposed to decrease series resistance of the device.

(2) Formation of a P-Side Contact Electrode Having an Aperture

Figure 6B:
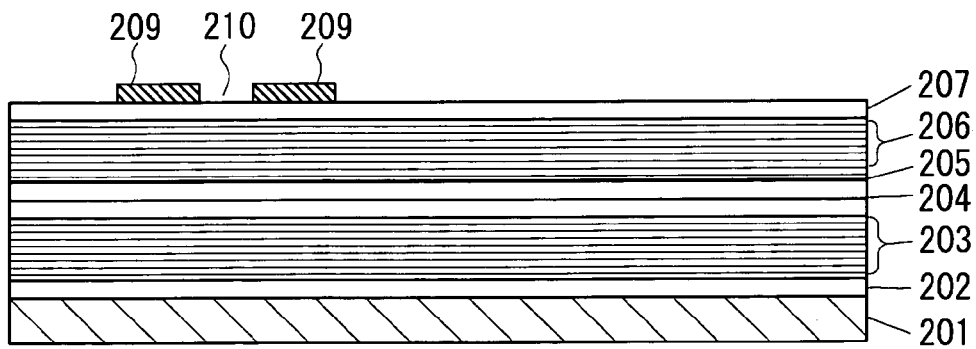

Then, as shown in FIG. 6B, on a top surface of the VCSEL substrate created by an MOVPE apparatus, a contact electrode 209 having an aperture 210 for emitting laser is created. An exemplary method of creating the contact electrode 209 is lift-off in which a resist pattern is formed on a surface of a substrate by a general photolithography, and after Ti and Au are sequentially deposited, the resist is lifted off to form an electrode. Alternatively, a method can be used in which, after Ti and Au are deposited, a resist pattern is formed on the Au by a general photolithography, and the Ti and Au are patterned by etching. For the material of the p-side electrode, other than Ti and Au, AuZn/Au, Ti/Pt/Au or the like can be used.

(3) Formation of a Protective Film

Figure 6C:
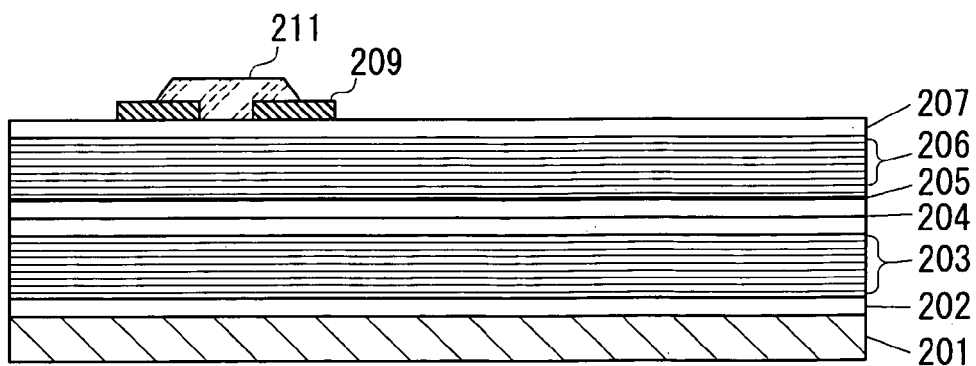

Next, on the whole surface of the VCSEL substrate including the contact electrode 209, an insulating film of SiON or SiO$_2$ is formed by a CVD apparatus or a sputtering apparatus or the like, and the SiON or SiO$_2$ is patterned by a general photolithography and etched to form a protective film 211, as shown in FIG. 6C. The etching may be dry etching with a buffered hydrofluoric (BHF) acid or fluoric etchant gas.

(4) Formation of a Mask for Etching a Post and for Etching a Via

Figure 7A:
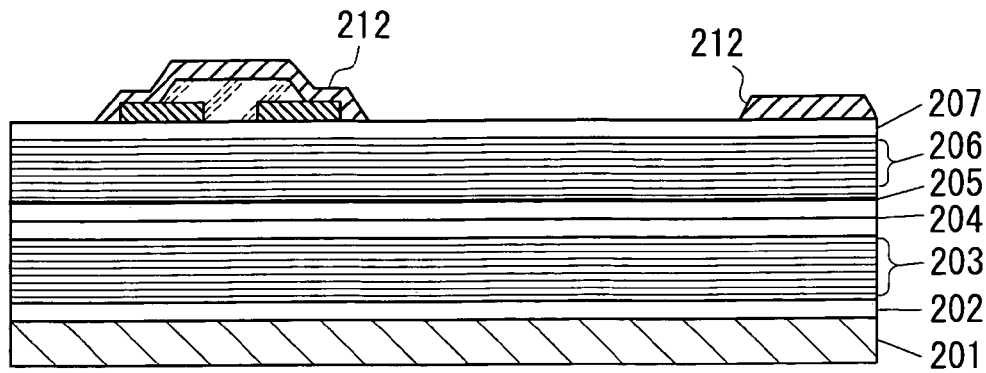
FIGS. 7A to 7C are cross sectional views showing manufacturing processes of an exemplary VCSEL device according to an aspect of the invention.

Then, to create a pillar-shaped post structure, an etching mask 212 is formed as shown in FIG. 7A. The etching mask 212 is created by forming an insulating film of SiON, SiNx by a CVD apparatus or a sputtering apparatus or the like, and by patterning it by photolithography and etching. The etching may be dry etching with a buffered hydrofluoric (BHF) acid or fluoric etchant gas.

(5) Formation of a Post and a Via

Figure 7B:
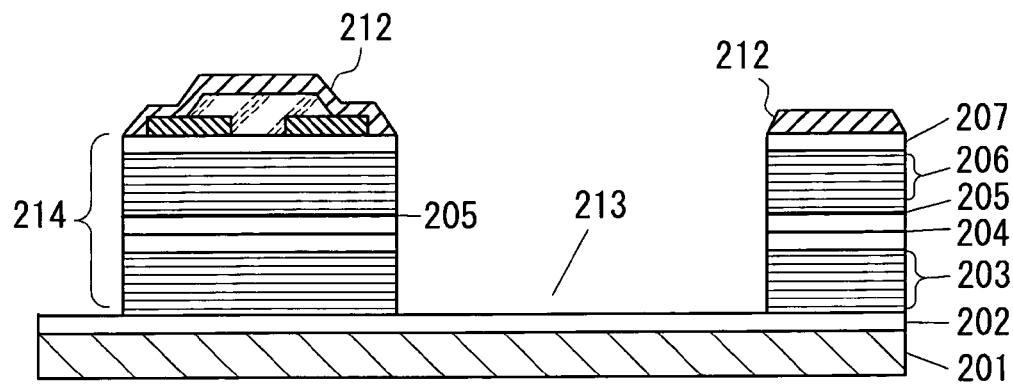

Next, as shown in FIG. 7B, other portion than the mask 212 is dry-etched by a dry etching apparatus using a chloric gas to a depth of between several micrometers and ten or more micrometers to form a post 214 and a via 213 concurrently. At this time, the depth of the etching is a depth in which cross section of multilayered films of the VCSEL substrate is exposed at least on a side surface of the post, and edge portion of the AlAs layer 205 is exposed. The via 213 may be a shape of a trench (groove).

(6) Formation of an AlAs Oxide Layer

Figure 7C:
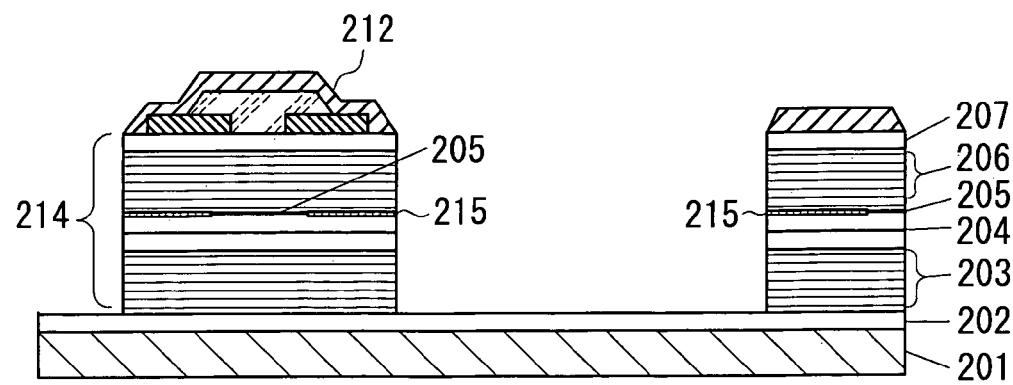

Then, as shown in FIG. 7C, immediately after the post 214 is created, it is inserted into an anneal oven, and selective oxidation of the AlAs layer 205 is performed by applying water vapor from the side surface of the post. At this time, annealing temperature is about 300 to 400 degrees Celsius. The water vapor is transferred into the oven by bubbling hot water at a temperature of 70 to 100 degrees Celsius in a hot water tank with a nitrogen carrier gas. When water vapor oxidation is performed, AlGaAs and AlAs layers, which have high Al composition, change into aluminum oxide (AlxOy). At this oxidation, because AlAs has a faster oxidation speed than AlGaAs does, only AlAs is selectively oxidized from the edge portion of the post side wall toward a center portion of the post, and then an oxide layer 215 is formed. By controlling the oxidizing time, it is possible to leave a desired size of the AlAs layer 205 at the center portion of the post. The oxide layer (AlxOy layer) 215 has an extremely low electrical conductivity and the AlAs layer 205 has a high electrical conductivity. Thus, a structure in which current flows only in the AlAs layer 205 that is left at the center portion of the post structure, i.e., a current confinement structure, can be formed.

(7) Formation of an Interlayer Insulating Film

Figure 8A:
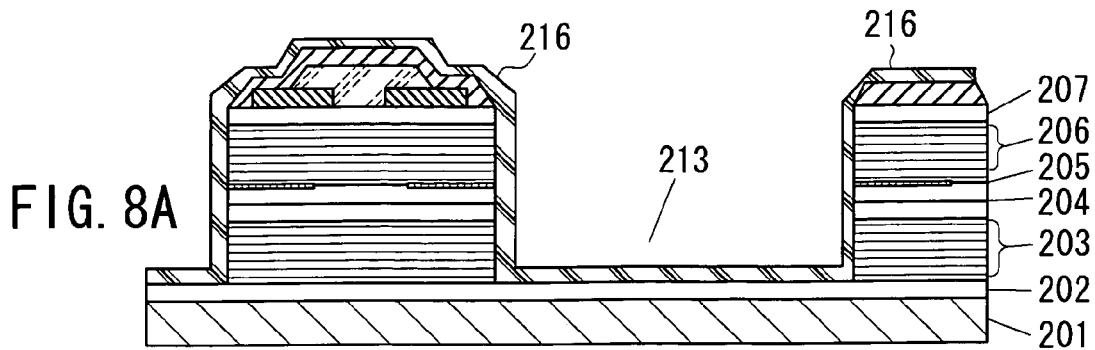
FIGS. 8A to 8D are cross sectional views showing manufacturing processes of an exemplary VCSEL device according to an aspect of the invention.
Figure 8B:
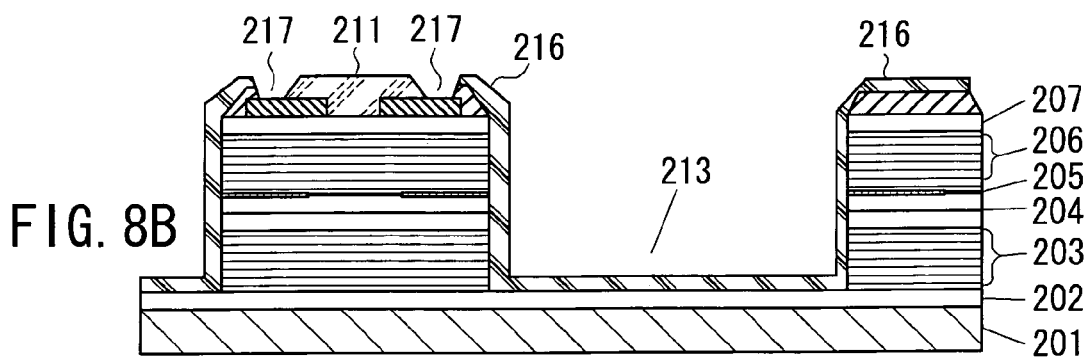

After the AlAs oxidation, the whole post is covered with an interlayer insulating film 216 of SiO$_2$, SiON, SiNx or the like, as shown in FIG. 8A. Formation of the insulating film may enhance the strength of the post itself that became weak because most of the AlAs layer became a porous AlxOy film due to the oxidation. In addition, the formation may also avoid the oxide layer (AlxOy layer) 215 from altering due to natural oxidation from the edge portion of the post side wall.

(8) Formation of a Contact Hole

Then, as shown in FIG. 5B, a contact hole 217 is formed for grounding a p-wiring electrode to the contact electrode 209 in a lower layer than the protective film 211 and the interlayer insulating film 216 at the upper portion of the post. The contact hole 217 may be formed by patterning by photolithography and by performing etching or dry-etching with a chemical solution of such as buffered hydrofluoric (BHF) acid or the like.

(9) Formation of a P-Wiring Electrode

Figure 8C:
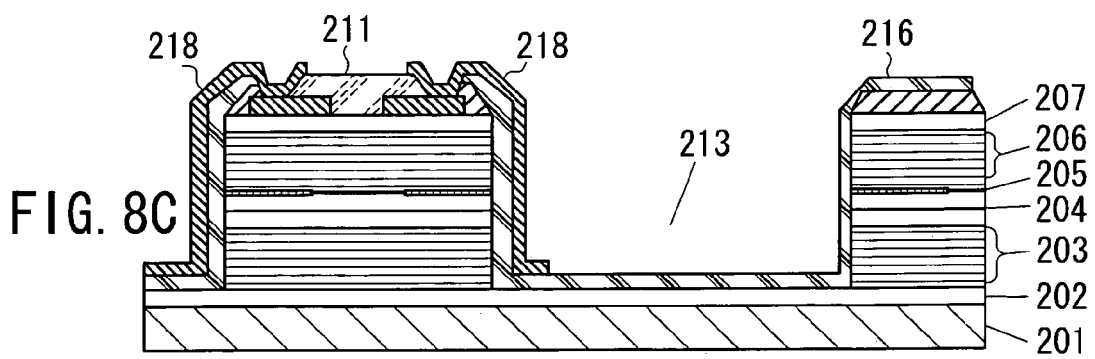

Next, as shown in FIG. 8C, a p-wiring electrode 218 is formed. An exemplary method of creating the p-wiring electrode 218 is lift-off in which a resist pattern is formed by a general photolithography and after Ti and Au are sequentially deposited, the resist is lifted off to form an electrode. Alternatively, a method can be used in which, after Ti and Au are deposited, a resist pattern is formed on the Au by a general photolithography, and the Ti and Au are patterned by etching. For the material of the p-side electrode, other than Ti and Au, AuZn/Au, Ti/Pt/Au or the like can be used.

(10) Formation of a Back Surface N-Electrode

Figure 8D:
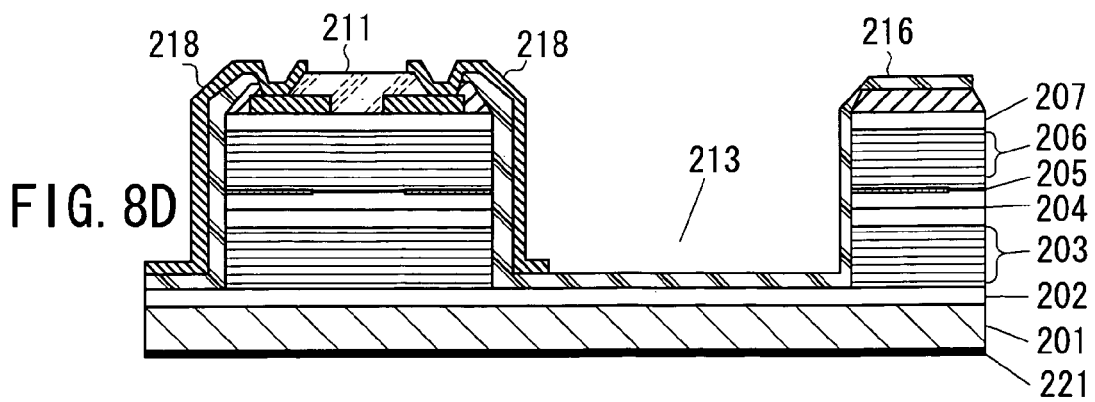

Then, as shown in FIG. 8D, an n-electrode 221 is formed on the back surface of the GaAs substrate 201 by a vapor deposition apparatus. For the material of the n-electrode, AuGe/Au and AuGe/Ni/Au can be used. To make the electrode a low resistance ohmic electrode, the electrode is annealed in a nitrogen atmosphere at a temperature of 350 to 400 degrees Celsius for several minutes.

(11) Formation of a Light Absorbing Heat Converting Region

Figure 9A:
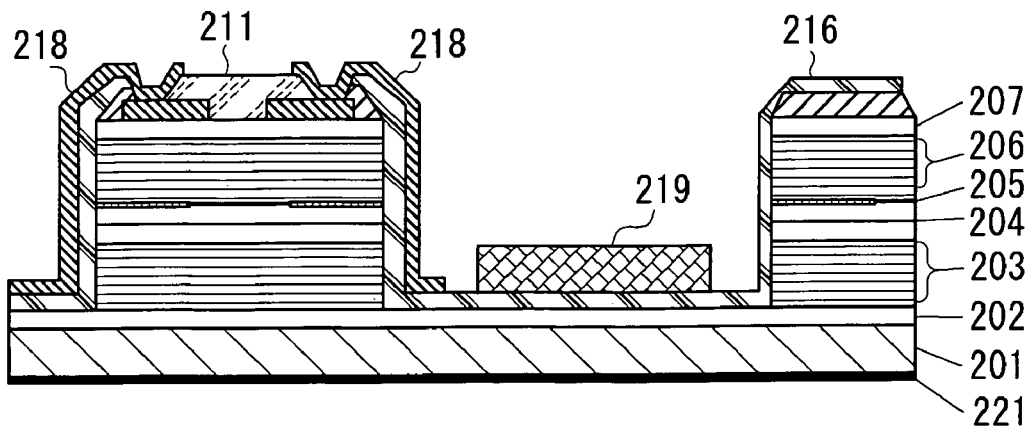
FIGS. 9A to 9C illustrate configuration examples of a light absorbing heat converting region.

As shown in FIG. 9A, at a bottom portion of the via 213, a light absorbing heat converting material 219, i.e., a material that absorbs light and generates heat, is formed. For the light absorbing heat converting material, any material that has a function of absorbing light and then generating heat can be used. For such a material, for example, a Ge—Sb—Te alloy such as Ge2Sb2Te5 used as a storage layer in a DVD-RAM, an Sb metal, an Ag—In—Sb—Te alloy, an Ag—In—Sb—Te—V alloy, or a compound such as lithium niobate or methyl nitroaniline can be used. The alloy or compound described above is deposited, or formed by sputtering or the like, and patterned by photoresist lift-off. The thickness of the light absorbing heat converting material is preferably about 50 nanometers to 100 nanometers in terms of light penetration length of the compounds described above.

Figure 9B:
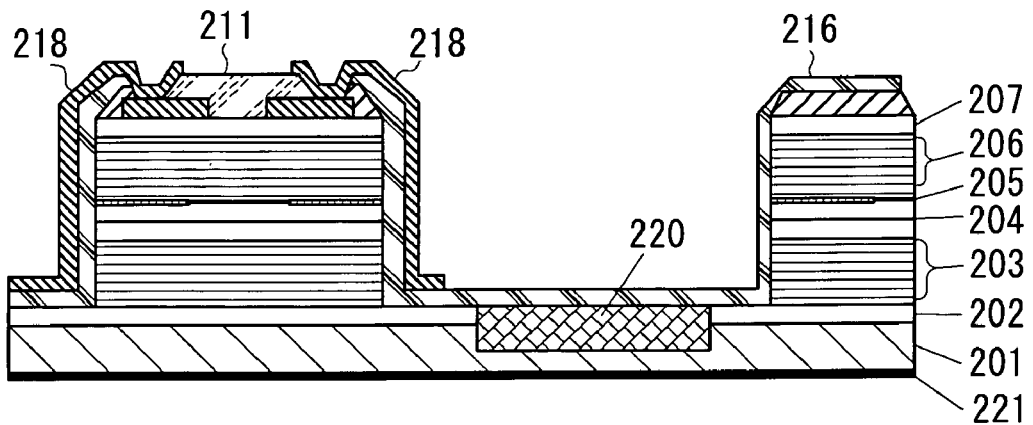

The light absorbing heat converting region can be formed in a method other than forming a compound. As shown in FIG. 9B, the underlying GaAs layer can be used as it is for a light-heat converting layer. In this case, the GaAs crystal in a region 220 that is to be the light absorbing heat converting layer may be altered, for example, by implanting proton to cause lattice defects or by making the region in an amorphous state. If the region 220 is altered as described above, absorbed light once excites electrons and holes in the crystal, but the electrons and holes are not converted into light upon their recombination, and thus the possibility that they become phonons and generate heat will increase. As such, absorbed light can be effectively converted into heat.

Figure 9C:
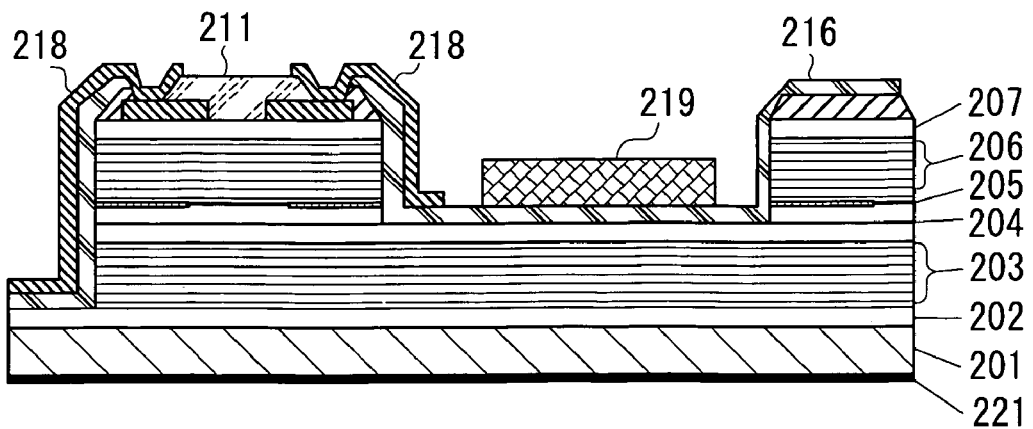

In addition, as shown in FIG. 9C, if the depth of the via 213 is formed by a shallow etching in advance such that the active layer 204 is exposed, the position where the light absorbing heat converting material 219 is formed can be at a position approximately same height as the active layer. This allows that the light absorbing heat converting material 219 is linked to the active region 204 of the light emitting portion through a layer having a high heat-conductivity. Therefore, the heat generated in the light absorbing heat converting material 219 can be effectively linked and conducted to a light emitting region of the laser element portion. In this case, impurities such as Si can be diffused in the DBR layers 203 to make the DBR layers in a mixed crystal state in order to reduce reflectivity so that light reaches the underlying GaAs.

As described above, a laser element portion of a post structure and a light absorbing heat converting region are monolithically formed on a substrate. Projection of laser light onto the light absorbing heat converting region can be performed according to an aspect shown in FIGS. 1A to 5.

Figure 10:
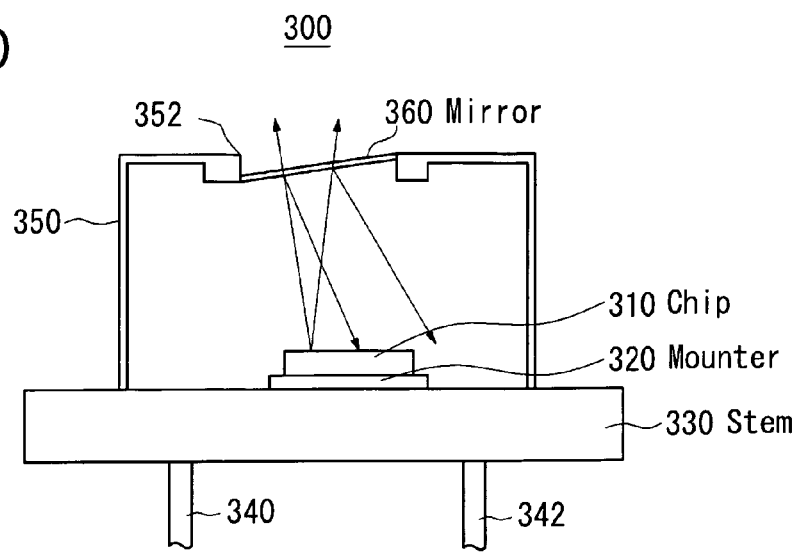
FIG. 10 is a schematic cross sectional view showing a package example of a VCSEL device according to an example of the invention.

FIG. 10 illustrates a schematic cross section when the VCSEL device shown in FIGS. 1A and 2B is used in a package (module). In a package 300, a chip 310 on which a laser-emitting portion and a light absorbing heat converting region are formed is mounted on a metal stem 330 through a conductive submount 320. To the metal stem 330, conductive leads 340 and 342 are inserted into through holes (not shown). One lead 340 is electrically connected through the submount 320 to an n-side electrode formed on the back surface of the chip 310. The other lead 342 is electrically connected to a p-side electrode pad formed on the upper surface of the chip 310 by a bonding wire or the like.

On the metal stem 330, a cap 350 is mounted, and an emitting window 352 is formed on the upper surface of the cap 350. To close the emitting window 352, a mirror 360 is mounted. The mirror 360 reflects a portion of laser light toward the light absorbing heat converting region. The angle of the mirror 360 and the distance between the mirror and the chip 310 may be adjusted such that reflected light projects onto the light absorbing heat converting region. When a forward voltage is applied between the leads 340 and 342, laser light is emitted from the chip 310. The laser light is outputted to outside through the mirror 360, and temperature/compensation can be performed by the light absorbing heat converting region.

Figure 11:
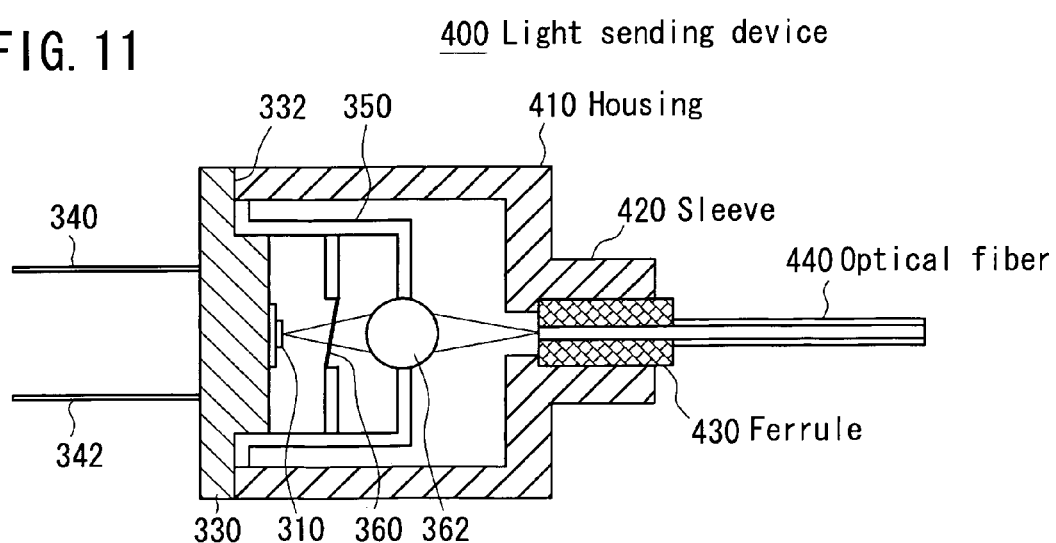
FIG. 11 is a schematic cross sectional view showing a configuration of a light sending device using the package shown in FIG. 10.

FIG. 11 is a cross sectional view of a configuration when the package or module shown in FIG. 10 is applied to a light sending device. A light sending device 400 includes a cylindrical housing 410 fixed to the metal stem 330, a sleeve 420 formed integral with the housing 410 on the edge surface thereof, a ferrule 430 held in an opening 422 of the sleeve 420, and an optical fiber 440 held by the ferrule 430. In a flange 332 formed in a direction of the circumference of the stem 330, an edge of the housing 410 is fixed.

The mirror 360 is attached to an emitting window of the cap 350, and a ball lens 362 is attached spaced from the mirror 360. The ball lens 362 is positioned to coincide with the optical axis of the laser element portion such that laser light from the laser element portion is emitted through the ball lens 362 into the optical fiber 440 held by the ferrule 430. In the example described above, the ball lens 362 is used, however, other than the ball lens, other lens such as a biconvex lens, a plano-convex lens or the like can be used. The light sending device 400 may include a driving circuit to apply an electrical signal to the leads 340 and 342. In addition, the light sending device 400 may include a receiving function to receive an optical signal through the optical fiber 440.

Figure 12:
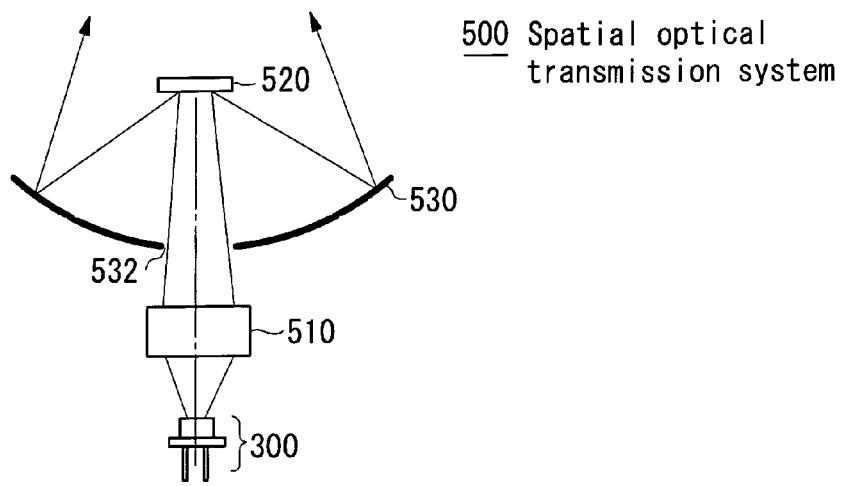
FIG. 12 illustrates a configuration when the package shown in FIG. 10 is used for a spatial transmission system.

FIG. 12 illustrates a configuration when the package shown in FIG. 10 is used for a spatial transmission system. A spatial transmission system 500 includes the package 300, a condensing lens 510, a diffusing plate 520, and a reflective mirror 530. In the spatial transmission system 500, instead of using the ball lens 362 that was used for the package 300, the condensing lens 510 is used. The light concentrated by the condensing lens 510 is reflected by the diffusing plate 520 through an opening 532 of the reflective mirror 530. The reflected light goes toward the reflective mirror 530. The reflective mirror 530 reflects the reflected light toward a predetermined direction to perform optical transmission. For a light source of spatial transmission, a multi-spot type VCSEL may be used to obtain a higher output.

Figure 13:
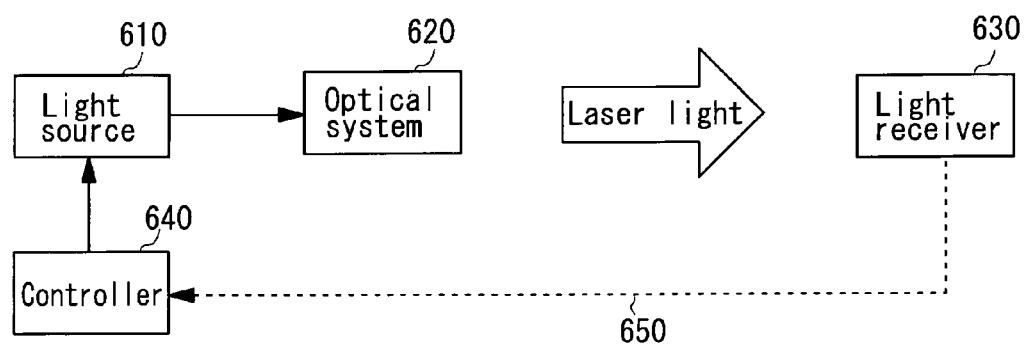
FIG. 13 is a block diagram showing a configuration of an optical transmission system.

FIG. 13 illustrates an example of a configuration of an optical transmission system in which a VCSEL is used as a light source. An optical transmission system 600 includes a light source 610 that contains the chip 310 on which a VCSEL is formed, an optical system 620, for example, for concentrating laser light emitted from the light source 610, a light receiver 630 for receiving laser light outputted from the optical system 620, and a controller 640 for controlling the driving of the light source 610. The controller 640 provides a driving pulse signal for driving the VCSEL to the light source 610. The light emitted from the light source 610 is transmitted through the optical system 620 to the light receiver 630 by an optical fiber or a reflective mirror for spatial transmission. The light receiver 630 detects the received light by a photodetector or the like. The light receiver 630 is capable of controlling operations (for example, the start timing of optical transmission) of the controller 640, by a control signal 650.

Figure 14:
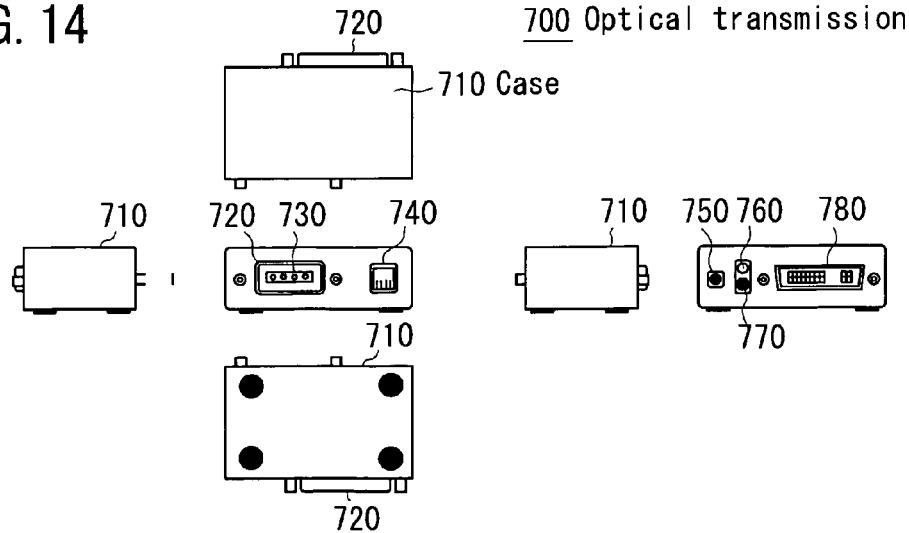
FIG. 14 illustrates external views of an optical transmission unit.

Next, a configuration of an optical transmission unit used for an optical transmission system is described. FIG. 14 illustrates external views of an optical transmission unit. An optical transmission unit 700 includes a case 710, an optical signal sending/receiving connector 720, a light emitting/light receiving element 730, an electrical signal cable connector 740, a power input 750, an LED 760 for indicating normal operation, an LED 770 for indicating an abnormality, a DVI connector 780, and a sending circuit board/receiving circuit board 790.

FIG. 15 illustrates a video transmission system in which the optical transmission unit 700 is used. An optical video transmission system 800 includes a video signal generator 810, an image display 820, an electrical cable 830 for DVI, a sending module 840, a receiving module 850, a connector 860 for video signal transmission optical signal, an optical fiber 870, an electrical cable connector 880 for control signal, a power adapter 890, and an electrical cable 900 for DVI. To transmit a video signal generated in the video signal generator 810 to the image display 820 such as a liquid crystal display, an optical transmission system as shown in FIG. 12 may be used.

While exemplary embodiments of the present invention have been described in detail, it is not intended to limit the invention to these specific exemplary embodiments. It should be understood that various modifications and changes may be made without departing from the inventive scope which is defined by the following claims.

In the examples described above, an AlAs layer is used for a current confinement layer, however, other than the AlAs layer, an AlGaAs layer can be used for a current confinement layer. In addition, in the examples described above, a semiconductor laser of GaAs system compound is shown, however, other than GaAs, a semiconductor laser using gallium nitride system or gallium indium system may be used.

A VCSEL device according to an aspect of the invention can be used in various fields such as optical data processing or optical high-speed data communication.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A vertical-cavity surface-emitting laser diode (VCSEL) device, comprising:

a laser element portion formed on a substrate, the laser element portion comprising a multi-layer reflective mirror of a first conductivity type, an active layer, and a multi-layer reflective mirror of a second conductivity type; and a light absorbing heat converting region at a position thermally connected to the laser element portion on the substrate, the light absorbing heat converting region absorbing light and generating heat; the light absorbing heat converting region comprising a compound that absorbs light and converts it into heat and is of any one of Ge—Sb—Te alloy, Sb metal, Ag—In—Sb—Te alloy, Ag—In—Sb—Te— alloy, lithium niobate, or methyl nitroaniline; the light absorbing heat converting region being formed, in a groove by removing a portion of a semiconductor layer of the laser element portion, and the light absorbing heat converting region being monolithically formed with the laser element portion on the substrate.

2. The VCSEL device according to claim 1, further comprising an optical component that projects a portion of laser light emitted from the laser element portion onto the light absorbing heat converting region.

3. The VCSEL device according to claim 1, further comprising a laser element for projection that emits laser light to the light absorbing heat converting region.

4. The VCSEL device according to claim 3, the laser element for projection being formed on a same substrate as the substrate the laser element portion is formed on.

5. The VCSEL device according to claim 3, further comprising an optical component that projects light from the laser element for projection onto the light absorbing heat converting region.

6. The VCSEL device according to claim 4, the laser element for projection being connected in parallel with a thermistor.

7. The VCSEL device according to claim 4, the laser element for projection being connected in series with a resistor.

8. The VCSEL device according to claim 2, the optical component comprising a reflective mirror.

9. The VCSEL device according to claim 4, the optical component comprising a condensing lens.

10. The VCSEL device according to claim 1, the compound having a layer thickness of about 50 to 100 nanometers.

11. The VCSEL device according to claim 1, the light absorbing heat converting region being a region in which the substrate or a semiconductor layer is altered by ion implantation.

12. The VCSEL device according to claim 1, the light absorbing heat converting region being a region in which the substrate or a semiconductor layer is made in a mixed crystal state.

13. The VCSEL device according to claim 1, the light absorbing heat converting region comprising a via formed by removing a semiconductor layer on the substrate.

14. The VCSEL device according to claim 13, the via having a depth that reaches an active layer on the substrate.

15. The VCSEL device according to claim 13, the laser element portion having a post structure formed on a substrate, and the via being adjacent to the post structure.

16. The VCSEL device according to claim 1, the substrate being formed of a GaAs semiconductor, the multi-layer reflective mirror of a first conductivity type and the multi-layer reflective mirror of a second conductivity type comprising an AlGaAs semiconductor layer.

17. A light transmission device comprising;
a VCSEL device; and
a transmitting component that transmits laser light emitted from the VCSEL device by an optical medium,
the VCSEL device including a laser element portion formed on a substrate, the laser element portion comprising a multi-layer reflective mirror of a first conductivity type, an active layer, and a multi-layer reflective mirror of a second conductivity type and including a light absorbing heat converting region at a position thermally connected to the laser element portion on the substrate, the light absorbing heat converting region absorbing light and generating heat; the light absorbing heat converting region comprising a compound that absorbs light and converts it into heat and is of any one of Ge—Sb—Te alloy, Sb metal, Ag—In—Sb—Te alloy, Ag—In—Sb—Te— alloy, lithium niobate, or methyl nitroaniline; the light absorbing heat converting region being formed, in a groove by removing a portion of a semiconductor layer of the laser element portion, and the light absorbing heat converting region being monolithically formed with the laser element portion on the substrate.

18. An optical spatial transmission unit comprising;
a VCSEL device; and
a transmission component that spatially transmits light emitted from the device,
the VCSEL device including a laser element portion formed on a substrate, the laser element portion comprising a multi-layer reflective mirror of a first conductivity type, an active layer, and a multi-layer reflective mirror of a second conductivity type and including a light absorbing heat converting region at a position thermally connected to the laser element portion on the substrate, the light absorbing heat converting region absorbing light and generating heat; the light absorbing heat converting region comprising a compound that absorbs light and converts it into heat and is of any one of Ge—Sb—Te alloy, Sb metal, Ag—In—Sb—Te alloy, Ag—In—Sb—Te— alloy, lithium niobate, or methyl nitroaniline; the light absorbing heat converting region being formed, in a groove by removing a portion of a semiconductor layer of the laser element portion, and the light absorbing heat converting region being monolithically formed with the laser element portion on the substrate.

19. A light sending system comprising;
a VCSEL device; and
a transmitting component that transmits laser light emitted from the device,
the VCSEL device including a laser element portion formed on a substrate, the laser element portion comprising a multi-layer reflective mirror of a first conductivity type, an active layer, and a multi-layer reflective mirror of a second conductivity type and including a light absorbing heat converting region at a position thermally connected to the laser element portion on the substrate, the light absorbing heat converting region absorbing light and generating heat; the light absorbing heat converting region comprising a compound that absorbs light and converts it into heat and is of any one of Ge—Sb—Te alloy, Sb metal, Ag—In—Sb—Te alloy, Ag—In—Sb—Te— alloy, lithium niobate, or methyl nitroaniline; the light absorbing heat converting region being formed, in a groove by removing a portion of a semiconductor layer of the laser element portion, and the light absorbing heat converting region being monolithically formed with the laser element portion on the substrate.

20. An optical spatial transmission system comprising;
a VCSEL device; and
a transmission component that spatially transmits light emitted from the device,
the VCSEL device including a laser element portion formed on a substrate, the laser element portion comprising a multi-layer reflective mirror of a first conductivity type, an active layer, and a multi-layer reflective mirror of a second conductivity type and including a light absorbing heat converting region at a position thermally connected to the laser element portion on the substrate, the light absorbing, heat converting region absorbing light and generating heat; the light absorbing heat converting region comprising a compound that absorbs light and converts it into heat and is of any one of Ge—Sb—Te alloy, Sb metal, Ag—In—Sb—Te alloy, Ag—In—Sb—Te— alloy, lithium niobate, or methyl nitroaniline; the light absorbing heat converting region being formed, in a groove by removing a portion of a semiconductor layer of the laser element portion, and the light absorbing heat converting region being monolithically formed with the laser element portion on the substrate.

* * * * *